United States Patent [19]

Baertsch et al.

[11] 4,124,861
[45] Nov. 7, 1978

[54] CHARGE TRANSFER FILTER

[75] Inventors: Richard D. Baertsch; William E. Engeler, both of, Scotia, N.Y.

[73] Assignee: General Electric Company, Schenectady, N.Y.

[21] Appl. No.: 618,747

[22] Filed: Oct. 1, 1975

[51] Int. Cl.$^2$ ............... H01L 29/78; G11C 19/28
[52] U.S. Cl. .................... 357/24; 307/221 D
[58] Field of Search ............... 357/24, 221 D, 304

[56] References Cited

U.S. PATENT DOCUMENTS

| 3,898,685 | 8/1975 | Engeler et al. | 357/24 |
|---|---|---|---|
| 3,906,542 | 9/1975 | Krambeck et al. | 357/24 |

OTHER PUBLICATIONS

Baertsch et al "A New Surface Charge Analog Store" IEEE Int. Electron Devices Meeting (12/73) pp. 134-137.

Primary Examiner—Stanley D. Miller, Jr.
Assistant Examiner—Gene M. Munson
Attorney, Agent, or Firm—Julius J. Zaskalicky; Joseph T. Cohen; Marvin Snyder

[57] ABSTRACT

A charge transfer filter includes an accumulator charge storage location and means for alternately introducing charge into the accumulator charge storage location and then for removing a preselected fraction of the total charge in the accumulator charge storage location so that the total accumulated charge is known.

2 Claims, 3 Drawing Figures

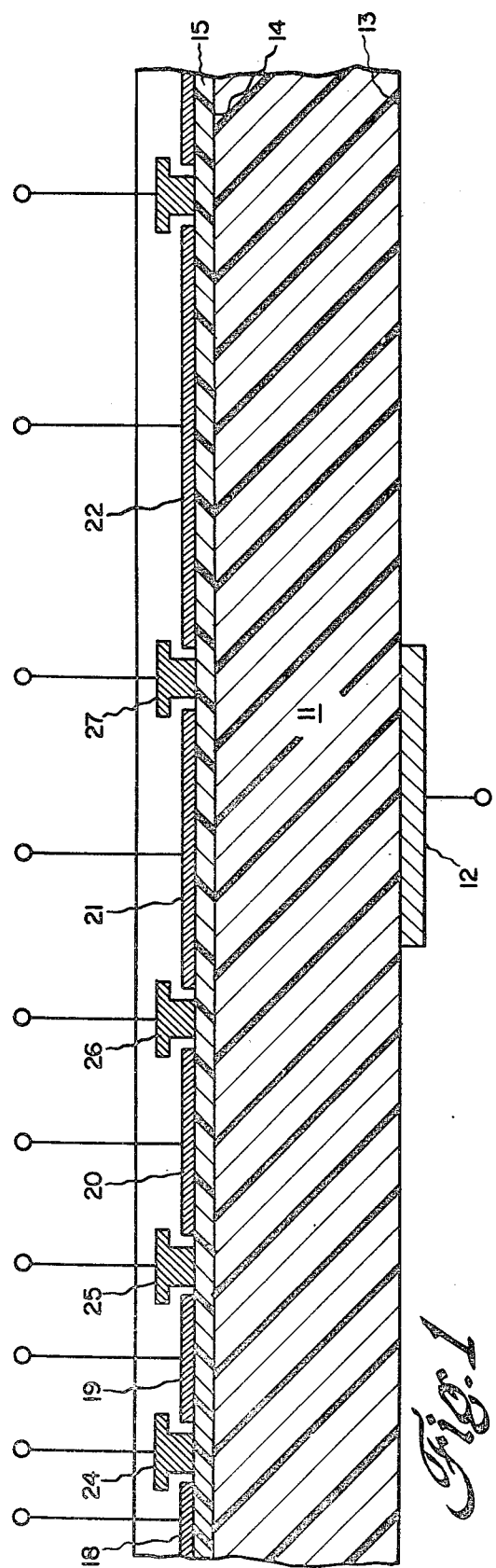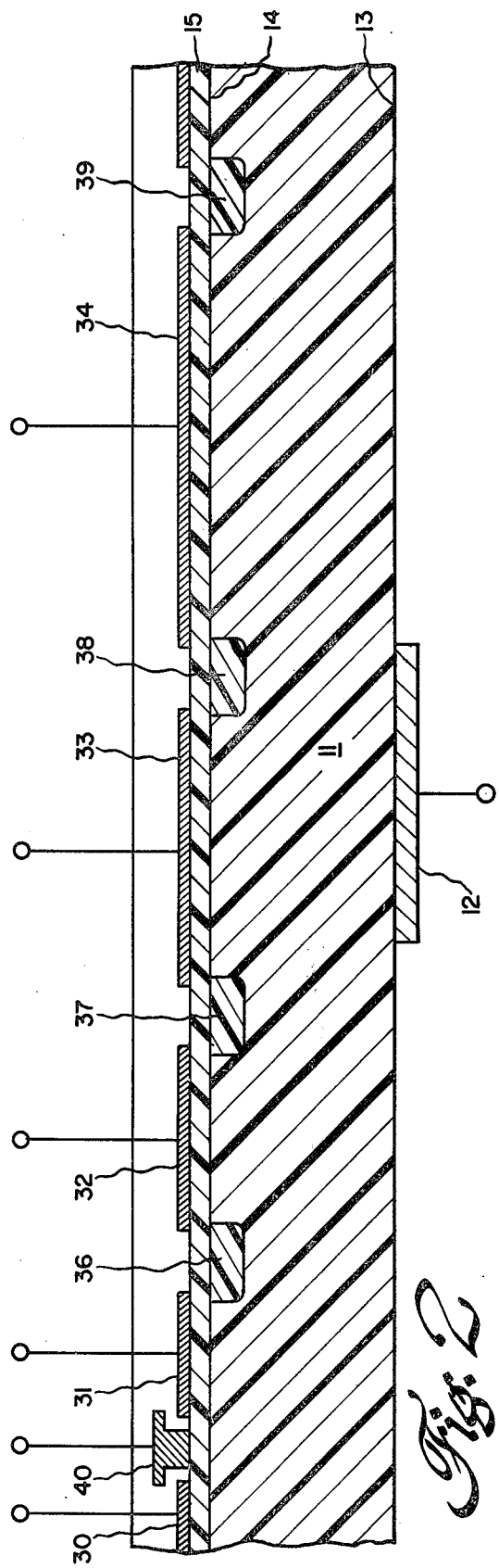

CHARGE TRANSFER FILTER

This invention relates in general to surface charge devices, and more particularly to a surface charge structure for providing, inter alia, for the first-order exponential smoothing of repetitive analog functions.

Surface charge transfer filters of the type with which this invention is concerned are usefully employed in analog signal processing equipment and they provide filter functions hereinbefore provided only by complex discrete circuitry. The advantages to be obtained through the use of surface charge transfer filter structures include small size and low cost along with ease of adjustment and reliability to mention only a few exemplary advantages. This invention is particularly concerned with non-recursive accumulator-type filter structures of the type described, for example, in copending U.S. patent application Ser. No. 618,838 of William E. Engeler et al. for *CHARGE TRANSFER FILTER*, now abandoned and refiled as continuation application Ser. No. 775,662 of common assignee herewith and the contents of which are hereby incorporated by reference.

It is a feature of accumulator-type surface charge transfer filters that the time constant thereof may be readily adjusted, for example, by varying the ratio between the sizes of accumulator and output charge storage locations thereof. It will be noted, however, that while a linear filter structure of the type described in the aforementioned copending application may be readily adjusted to provide a variable time constant, the settling time, that is to say, the time during which charge which is transferred into an accumulator stage, equilibrates or equilizes in surface potential throughout the extent of the accumulator stage, increases with the increase in size of the accumulator stage and larger time constants require longer settling or equilibration periods. Further, since at least one method for decreasing the time constant of a surface charge transfer filter has been to utilize only a small effective portion of a large accumulator charge storage location by adjusting the surface potential of that portion of the accumulator charge storage location not desired to be utilized, the time required for the lateral transfer of charge over the unused portion is largest for the smallest time constants.

It is desirable to increase the maximum permissible speed of surface charge transfer filters of the type with which this invention is concerned and, accordingly, It is an object of this invention to provide a surface charge transfer filter capable of operation at higher speeds than those heretofore known.

It is another object of this invention to provide a surface charge transfer filter wherein the long charge transfer periods associated with short filter time constants are substantially eliminated.

It is yet another object of this invention to provide a surface charge transfer filter even more readily adjustable than prior art types.

It is yet another object of this invention to provide a simplified method of inserting and removing charge from the various portions of the filter. than those heretofore known.

Briefly stated and in accordance with one aspect of this invention, a surface charge transfer filter includes an accumulator charge storage location and means for alternately unilaterally introducing charge into the accumulator charge storage location and then removing a preselected fraction of the total charge in the accumulator charge storage location so that the total accumulated charge is known.

In one embodiment of this invention, a shift register is utilized to create a plurality of charge samples in a like plurality of charge storage locations, the magnitude of each charge sample being proportional to the magnitude of a repetitive analog signal at a specific point in time. These charge samples are tranferred along the shift register into a plurality of accumulator associated charge storage locations of the shift register, allowed to equilibrate, and then a plurality of output signals, each equal to a preselected fraction of the total charge in each accumulator and its associated charge storage site is isolated in the same plurality of shift register charge storage locations and, finally, clocked-out sequentially to reconstruct the analog signal in an exponentially smoothed manner.

The features of the invention which are believed to be novel are pointed out with particularity in the appended claims. The invention itself, however, both as to its organization and method of operation together with further objects and advantages thereof may best be understood by reference to the following description take in connection with the accompanying drawings, in which:

FIG. 1 is a partial section view of a single stage of a charge transfer filter in accordance with one embodiment of this invention;

FIG. 2 is a partial section view of a single stage of a charge transfer filter in accordance with another embodiment of this invention.

Figure 3:
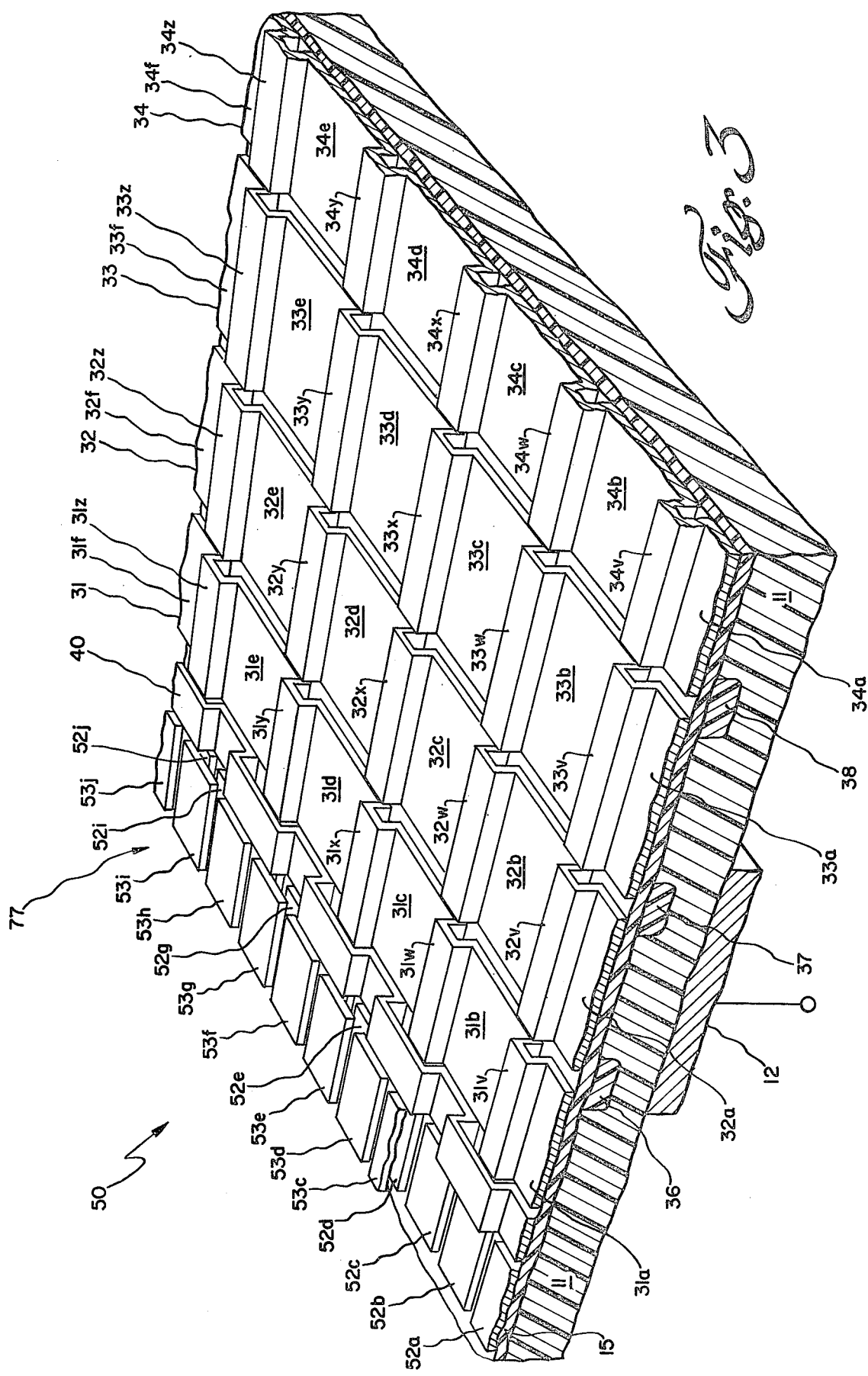
FIG. 3 is a perspective view of a charge transfer filter in accordance with this invention.

A cross section of a single section of a charge transfer filter in accordance with this invention is shown at FIG. 1. A semiconductor substrate 11 is provided having at least one ohmic contact 12 to a first major surface 13 thereof. It is to be understood that ohmic contact 12 may be formed in a number of ways, as will be appreciated by one skilled in the art, for example, but not limited to a metallic contact directly bonded or alloyed to semiconductor substrate 11, or by providing a heavily-doped layer of semiconductor material which contacts major surface 13 and which has a metallic contact attached thereto. The precise method for making ohmic contact to semiconductor substrate 11 is not critical to the operation of this invention and may be practiced in accordance with well known semiconductor device fabrication techniques. Semiconductor substrate 11 itself may be either of p-type or n-type semiconductor material as described, it being understood that the choice of conductivity type will dictate the polarity of the various voltages to be applied to the elements of the surface charge transfer filter in accordance with this invention to be hereinbelow described. For purposes of illustrating this invention, it will be assumed that substrate 11 is of n-type silicon material. It is to be understood that while silicon will be utilized for purposes of illustrating this invention that other semiconductor materials well known to those skilled in the art may be satisfactorily utilized. A thin insulating layer 15 overlies second major opposing surface 14 of semiconductor substrate 11. Insulating layer 15 may conveniently be formed of silicon dioxide, for example, by exposing substrate 11 to an oxidizing atmosphere. Other insulating layers and combinations of insulating layers are as well known in the art, such as layered silicon nitride (Si₃N₄) over silicon dioxide (SiO₂), may equally well be employed if desired and this invention is not intended to be limited to any specific type of insulating layer. It is, of course, required that insulating layer 15 be of sufficient thickness, depending upon the material employed, to withstand the voltages to be applied to the electrodes which will overlie it. Electrical conductors 18, 19, 20, 21 and 22 overlie insulating layer 15. Electrical conductors 18 through 22 are operative to form charge storage locations at the surface of semiconductor substrate 11 when appropriate potentials are applied thereto. Electrical conductors 18 through 22 are formed by any of the well known techniques for forming conductive regions on insulating materials in the semiconductor art. For example, layers of doped polycrystalline silicon or layers of tungsten, molybdenum or aluminum, may be readily employed. No particular method for forming electrodes 18 through 22 is required in accordance with this invention and any of the well known techniques for forming conductive electrodes on an insulating layer may readily be employed.

Gate electrodes 24, 25, 26 and 27 provide for the control of the extent of the charge storage locations underlying electrodes 18 through 22. By the proper application of voltages between electrodes 24 through 27 and electrode 12, barrier regions may be created between any two of the surface-adjacent electrodes 18 through 22.

By way of example, assume that semiconductor substrate 11 is of n-conductivity type and that the device, therefore, is suited for the storage of holes. Charge storage locations are formed underlying electrodes 18 through 22 by the application of a negative voltage of, for example, approximately 10 volts between electrode 12 and the electrodes selected from 18 through 22 under which it is desired to form a charge storage location. The charge is transferred from beneath one surface-adjacent electrode to another by adjusting the potential at each of the electrodes so that the potential at the electrode towards which it is desired to transfer charge is more negative than the electrode from which charge is to be transferred. For example, referring to FIG. 1, assume that a charge sample is being stored at the surface of the semiconductor substrate underlying electrode 18. Further assume that the potential at electrode 18 is $-10$ volts with respect to electrode 12. If, for example, the potential at electrode 19 is increased to $-15$ volts, charge will tend to flow from the charge storage location underlying electrode 18 to the charge storage location underlying electrode 19. A potential applied to electrode 24 will control the flow of charge between electrodes 18 and 19 in the following way. Assume, first, that a potential of 0 or nearly 0 volts is applied electrode 24. A potential barrier will be created thereby and no charge will be transferred from the charge storage location underlying electrode 18 to the charge storage location underlying electrode 19. If, however, the voltage applied to electrode 24 is increased to $-12$ volts, charge will be transferred from the charge storage location underlying electrode 18 to the charge storage location underlying electrode 19. Assume further that all charge is transferred from the charge storage location underlying electrode 18 to that underlying electrode 19 and then that the potential applied to electrodes 18 and 24 is increased to create a charge storage location underlying electrodes 18, 24 and 19 having an equal potential throughout. The charge will equilibrate in this charge storage location and be distributed uniformly under each of the electrodes. Now, further assume that the potential applied to electrode 24 is decreased to 0 volts. There will be formed two substantially isolated charge storage locations and the charge in each will be proportional to the area of the electrode overlying it. For example, assuming that electrodes 18 and 19 are of substantially identical size, decreasing the voltage applied to electrode 24 will substantially divide the charge previously underlying electrodes 18, 24 and 19 into two substantially identical fractions, each including one-half the charge previously stored under the three electrodes. The charge in the charge storage location underlying electrode 18 may then be measured or removed as is desired and will give an accurate indication of the total charge which was present in the undivided charge storage location. It will be appreciated that the voltages applied to electrodes 24, 25, 26 and 27 may be somewhat higher than the voltages applied to electrodes 18 through 22 to form the same potential at the surface of semiconductor substrate 11. This is due to the fact that electrodes 24 through 27 are often at a greater distance from the substrate than electrodes 18 through 22. This depends on the details of the specific process sequence used to fabricate the device, as is known to those skilled in the art. While electrodes 24 through 27 are illustrated in FIG. 1 as lying partially on a plane somewhat above the plane of electrodes 18 through 22, it will be appreciated that this arrangement is exemplary only and in no way is required by this invention. For example, electrodes 24 through 27 might be readily lie totally on the same plane as electrodes 18 through 22 and be interspaced therewith. Electrodes 24 through 27 may also be formed of the same material as electrodes 18 through 22 or may be formed of different material selected from those mentioned previously. For example, both electrode systems may comprise doped polycrystalline silicon, or electrodes 18 through 22 may consist of doped polycrystalline silicon with electrodes 24 through 27 formed by patterning a layer of deposited aluminum. The placement of electrodes 24 through 27 overlapping electrodes 18 through 22, as illustrated in this exemplary embodiment of this invention, provides a structure which is readily manufactured since a slight amount of misregistration of the overlap between electrodes is tolerable. In the foregoing example, it was assumed that the voltage applied to electrode 25 was 0 volts and that the charge storage locations underlying electrodes 18, 24 and 19 did not extend laterally past the most remote edge of electrode 19 as viewed from the left in FIG. 1. Where it is desirable to create a filter having a longer time constant, this may be accomplished by decreasing the ratio of the size of the charge storage location underlying electrode 18 to the total size of the charge storage location underlying the electrodes which are selected during operation. For example, assume that a charge storage location encompassing the surface of the semiconductor substrate underlying electrodes 18 through 21 is desired. Further assume that a charge sample is present in the charge storage region underlying electrode 18 which is isolated by a voltage of, for example, 0 volts, applied to electrode 24. A potential is applied to electrodes 19, 20 and 21 which is equal to the potential applied to electrode 18 so that upon lowering the barrier created by electrode 24, the charge will be transferred between the surface regions underlying electrodes 18 and 19 through 21 until equilibration of the total charge results. Further, potentials are applied to electrodes 25 and 26 to create a substantially uniform surface potential region extending from electrode 19 to electrode 27. A potential of, for example, 0 volts is applied to electrode 27 to terminate the charge storage location thereunder. Assume now that the potential applied to electrode 24 is increased and that charge is transferred between the charge storage location underlying electrode 18 to the larger charge storage location underlying electrodes 19 through 21, including electrodes 25 and 26. The potential applied to electrode 18 is now at the same level as the potential applied to electrodes 19 through 21 and the charge equilibrates in the region underlying electrodes 18 through 21. The potential applied to electrode 24 is now reduced to, for example, 0 volts and a fraction of the total charge previously underlying electrodes 18 through 21 is isolated in the charge storage location underlying electrode 18 only.

This fraction is determined by the ratio of the area of the electrode 18 to the total area of electrodes 18 through 21 and the effective area of electrodes 25 and 26. The effective areas of electrodes 25 and 26 will be determined by the thickness of insulating layer 15 and the precise construction of electrodes 25 and 26. The embodiment of this invention hereinabove described is especially suited to be utilized whenever it is desired that an output sample be taken each time an input sample is applied to the accumulator portion of the device. Where it is desired that several input samples be added to the accumulator portion of the device before an output sample is taken an alternative mode of operation of the device illustrated at FIGS. 1 and 2 may be utilized. Assume a sample is present underlying electrode 18. Electrodes 19, 20, 21, 25 and 26 are supplied with electrical potentials to create a substantially uniform charge storage location thereunder, the potentials being sufficiently greater than the potential applied to electrode 18 that charge will flow from beneath electrode 18 to the charge storage location now defined by electrodes 18 through 21 and 25 and 26. A potential is applied to electrode 24 to create a barrier between the charge storage location underlying electrode 18 and the large charge storage location. The sample underlying electrode 18 is substantially isolated therefore. The sample underlying electrode 18 is transferred into the large charge storage location by increasing the voltage on electrode 24 to a value such that the surface potential under electrode 24 is equal to that under electrodes 19 through 21 or somewhat intermediate to the surface potential under electrode 18 and the surface potential under electrodes 19 through 21. In this way, all the charge beneath electrode 18 will be transferred to the accumulator charge storage location. The voltage on electrode 24 is now decreased to 0 or near 0 volts and the charge in the accumulator charge storage location is isolated so that a new charge sample may be clocked in underlying electrode 18. When as many charge samples have been transferred into the accumulator charge storage location as is desired, an output sample may be taken in the following way. The voltage on electrode 18 is increased to be equal to the voltage applied to electrode 19 through 21 and then the voltage on electrode 24 is increased such that the surface potentials under all electrodes are at the same level so that the single large charge storage location is formed underlying electrodes 18 through 21 and 24 through 26. After a suitable time so that equilibration occurs in this single charge storage location, the potential on electrode 24 is decreased to zero or near zero volts and a fraction of the total charge is isolated under electrode 18 which fraction may then be clocked out or utilized as desired. As was hereinbefore described, the charge sample underlying electrode 18 may now be utilized as desired as, for example, by serially shifting a plurality of samples from a filter structure including a plurality of parallel stages of the type illustrated in FIG. 1. A structure of this type is illustrated in FIG. 3 and will be hereinbelow described in greater detail.

Referring first, however, to FIG. 2, there is illustrated a single section of a surface charge transfer filter having adjustable time delay in accordance with another embodiment of this invention. A semiconductor substrate 11 is provided as was described in conjunction with the embodiment of this invention illustrated at FIG. 1 having first and second opposing major surfaces 13 and 14, major surface 13 having an electrical contact 12 in intimate proximity therewith. An insulating layer 15 overlies major surface 14 and a plurality of conducting electrodes 30, 31, 32 and, 33 and 34 overlies insulating layer 15. Diffused regions 36, 37, 38 and 39 extend from major surface 14 down towards second major surface 13 in substrate 11. Where substrate 11 is of n-conductivity type, diffused regions 36–39 are preferably of p-conductivity type. Electrode 40 which may conveniently be located on a plane somewhat above the plane in which electrodes 30 through 33 are located, functions as a gate electrode. The operation of the embodiment of this invention illustrated at FIG. 2 is substantially similar to that described hereinabove in conjunction with FIG. 1 save only that electrodes 25, 26 and 27 of FIG. 1 are replaced by diffusions 36, 37 and such further diffusions as may be required (not illustrated). The operation of the embodiment of this invention illustrated at FIG. 2 may be most readily understood by assuming that initially a charge sample is stored at the surface of semiconductor substrate 11 underlying electrode 30. Assume further that a voltage, as, for example, 0 volts, is applied to electrode 40 to substantially isolate the storage region beneath electrode 30 from the remaining portion of the structure. Assume that it is desired to form a charge storage location, the maximum extent of which is defined as underlying electrodes 30, 31 and 32 but not 33. The voltage is applied to electrodes 31 and 32 to create the thereunder a charge storage location having the potential such that charge will flow from the charge storage location underlying electrode 30 to the charge storage locations underlying electrodes 31 and 32 when the electrical barrier created by the voltage applied to electrode 40 is removed. As was hereinbefore described, where a device suited for the storage of holes is used, this may be accomplished in one mode of operation by applying a more negative voltage to electrodes 21 and 32 than is applied to electrode 30 and by increasing the surface potential underlying control electrode 40 to a more negative value than that existing under electrode 30. After the charge previously stored under electrode 30 has been transferred to the charge storage locations underlying electrodes 31 and 32, the potential on electrodes 30 and 40 is increased to a level such that charge equilibrates in the charge storage location uniformly formed underlying electrodes 30 through 32 and 40. After equilibration has taken place, the potential applied to electrode 40 is reduced to, for example, 0 volts to substantially isolate that portion of the total charge underlying electrode 30, which may then be removed as desired, for example, as was hereinabove described in conjunction with electrode 18 of FIG. 1.

The limits of the charge storage location underlying electrodes 31, 32 and 33 is defined by the voltages applied thereto. For example, where electrodes 31 and 32 have voltages applied such that charge storage locations are formed, as, for example, a negative voltage, and electrode 33 has applied thereto a zero or positive voltage, the charge storage region will be prevented from extending under electrode 33. Similarly, where it is desired that the charge storage location extend only as far as electrode 31, electrode 32 is supplied with a zero or positive voltage to so terminate the charge storage location. It can be seen that the function of the device illustrated in FIG. 2 is similar to the embodiment of this invention illustrated in FIG. 1 save only that the functions of electrodes 25 through 27 of FIG. 1 are replaced by diffusions 36 and 37 of FIG. 2. This device may therefore be operated in the alternative modes mentioned previously in connection with the device of FIG. 1.

It will be appreciated by reference to FIGS. 1 and 2 along with the description associated therewith that the time constant of a filter in accordance with this invention is directly related to the area under which charge can be stored or the fraction of the total charge storage area which underlies electrode 18 in FIG. 1 and 30 in FIG. 2. The way in which the time constant of a filter in accordance with this invention varies with the total area of the electrodes selected depends, of course upon the relationship therebetween. Where it is desirable to obtain a wide range of time constants, it is preferred to select electrodes 19 through 22, for example, in FIG. 1 to have a geometric relationship between the areas thereof. For example, the area underlying electrode 19 might arbitrarily be assigned a value of 1, for purposes of description, and the areas of electrodes 20, 21 and 22 are 2, 4 and 8, respectively. Assuming that the area of electrode 18 is substantially identical to that of electrode 19, it will be appreciated that a wide range of relationships between the areas of electrode 18 and of 18 plus one or more of 19, 20, 21 and 22 may be obtained. Further, it will be appreciated that in contradistinction to prior art types of surface charge transfer filters for exponential smoothing, where a short time constant is desired, it is unnecessary to provide for the transfer of charge underneath unused gates to gates in active operation as was hereinbefore required, but rather the shortest time constants are obtained through the use of surface-adjacent gates.

Where it is desired to obtain a somewhat narrower range of values for time constant in a filter of the type to which this invention is directed, but with a higher degree of resolution therebetween, the same may be accomplished by using a plurality of gates of similar size. For example, a structure of the type illustrated in FIG. 1 may be employed wherein gates 18 through 22 are of the same area and, therefore, wherein the addition of gates results in an increase in total area which proceeds arithmetically rather than geometrically as hereinbefore described. It will be clear to one skilled in the art that this invention is not limited to any particular selection of gate sizes or relationships and that combinations of the two methods hereinabove described or other methods within the true spirit and scope of this invention may appropriately be employed by one skilled in the art to provide the required range and resolution.

FIGS. 1 and 2 hereinabove described have illustrated single stages of an adjustable charge transfer filter in accordance with this invention. The operation and co-operation of a plurality of stages of the type illustrated in FIGS. 1 and 2 may be most readily understood by referring now to FIG. 3 wherein a portion of an adjustable charge transfer filter in accordance with this invention is illustrated in perspective form. The filter, indicated generally at 50, includes two major structural elements for forming charge storage locations and a single control element for regulating the transfer of charges therebetween. An input/output surface charge transfer shift register 77 comprises a first plurality of laterally spaced apart electrodes insulatingly disposed over semiconductor substrate 11 by insulating layer 15. A first plurality of laterally spaced apart surface adjacent electrodes 52a through i are operative upon the application of suitable electrical potentials, depending upon the type of semiconductor substrate utilized and the thickness of oxide layer 15, to form surface charge storage locations thereunder. A second plurality of electrodes 53a through i is operative to control the transfer of charge between the charge storage locations underlying electrodes 52a through i. The operation of surface charge transfer shift registers is well known in the art and a detailed explanation will not be offered herein. If a more detailed description and explanation is desired, reference may conveniently be made to U.S. Pat. No. 3,795,847 to Engeler and Tiemann for METHOD AND APPARATUS FOR STORING AND TRANSFERRING INFORMATION, the disclosure of which are herein incorporated by reference. It will be appreciated by one skilled in the art and with reference to the above-identified United States patent that surface charge transfer shift registers may be implemented in a number of physical forms. This invention is not limited to any particular form of shift register structure and requires only that the form employed provide a series of laterally spaced apart surface charge storage locations thereunder. As is well known, surface charge transfer shift registers may employ clocks of one, two or more phases for providing unidirectional charge transfer. The adjustable charge transfer filter of FIG. 3 illustrates a shift register structure suitable for control by a single phase clock, if desired.

The surface charge transfer shift register illustrated in the embodiment of this invention of FIG. 3 omits any input or output shift register sections. It is to be understood by one skilled in the art that to the extent that a large number of methods are known for transforming analog signals to charge samples and for accomplishing the reverse process, and further to the extent that one skilled in the art will appreciate that any of a number of these techniques may be equally well employed in accordance with this invention, the operation and advantages of this invention may be most clearly shown by omitting shift register input and output sections. The structure of an exemplary input and output stage for a charge transfer device are illustrated, for example, in U.S. Pat. No. 3,770,988 to Engeler et al for SELF REGISTERED SURFACE CHARGE LAUNCH-RECEIVE DEVICE AND METHOD FOR MAKING, the disclosure of which is herein incorporated by reference. It is assumed therefore that the adjustable charge transfer filter 50 is but a portion of a device including a large plurality of stages of the type illustrated and, in addition, appropriate input and output stages. In operation, charge packets representing samples of an analog waveform are sequentially transferred from each shift register stage to the next as, for example, from 52a to 52b and then to 52c and so on depending upon a number of stages employed in the particular embodiment of this invention, which, in turn, depends upon the number of samples desired per repetition of the analog waveform to be smoothed. Each repetition of the analog waveform may be seen, therefore, to be divided into a plurality of charge samples, the magnitude of the samples being proportional to the magnitude of the analog waveform at a particular instant in time.

The operation of adjustable filter 50 may be more easily understood by observing that it is comprised of a plurality of filters of a type illustrated at FIG. 2. It will be appreciated that a cross section taken through any of the stages of filter 50 will substantially correspond to the structure illustrated at FIG. 3. Electrode 52c corresponds to electrode 30 of FIG. 2. Further, electrode 40 corresponds to the like numbered electrode of FIG. 2 as do electrodes 31, 32, 33 and 34. Similarly, diffusions 36 through 39 correspond to the like numbered elements of FIG. 2.

Input/output shift register elements 53a through i will be observed to be spaced vertically from electrodes 52a through i. It will be appreciated one skilled in the art that a layer of insulating material (not illustrated) is required to effect the structure illustrated. FIG. 3 is, as will be readily apparent, a somewhat simplified structural illustration omitting several nonactive insulating regions in the interest of clarity and in order to more effectively illustrate the required active electrodes. Accordingly, therefore, although not illustrated, it will be appreciated by one skilled in the art that the structure illustrated at FIG. 3 necessarily includes, in an actual embodiment, those omitted insulating layers and suitable passivating layers as are commonly employed in integrated circuit construction. Further, it is to be understood that means for providing electrical contact to the various electrodes must be provided as would be readily accomplished by one skilled in the art.

FIG. 3 illustrates an embodiment employing a two phase shift register structure having two shift register storage locations for each accumulator section. Storage sections underlying 52c and 52e communicate with accumulator sections underlying electrode elements 31b and 31c, respectively. The storage element 52b, on the other hand, serves only as a storage cell of the input/output shift register. It should be understood that while this specific embodiment is illustrated by way of example other embodiments employing three or more phases are possible. In each case only the storage sites associated with one of the phases need communication with the associated accumulator sections. Other input/output systems which employ gating charge into a series of storage locations may also be employed in connection with the accumulator array, such as utilized in U.S. Pat. No. 3,801,883, to J. J. Tiemann entitled SURFACE CHARGE SIGNAL CORRELATOR. Referring specifically to electrodes 31, 32, 33 and 34 of FIG. 3, it will be noted that each of these electrodes is a continuous electrode having alternating elevated and depressed regions. These elevations and depressions may conveniently be formed by providing, prior to the formation of electrodes 31 through 34, similarly alternating regions of thick and thin oxide layers as may be readily obtained by etching processes. In operation, voltages applied to electrodes 31 through 34 will create surface charge storage locations in semiconductor substrate 11 only under the depressed electrode regions corresponding to the regions of thin oxide 31a through e through 34a through e while the electric field produced under elevated electrode regions corresponding to the regions of thick oxide 31v through z through 34v through z will be of insufficient magnitude to form effective charge storage locations thereunder.

As will be recalled from the discussion in conjunction with FIGS. 1 and 2, the ratio between the areas of the charge storage locations underlying the surface charge transfer shift register electrodes and the combined areas underlying the selected active electrodes 31 through 34 determines the effective filtering time constant of the device. It is emphasized that the particular size relationship between the elements of the embodiment of this invention illustrated at FIG. 3 are exemplary only and that variations might well be made by one skilled in the art in order to realize a particular filtered characteristic or range of adjustment. For example, while the embodiment of this invention illustrated at FIG. 3 includes a plurality of accumulator electrodes of increasing size, that is to say 31 is smaller than 32 which in turn is smaller than 33 and so on, it may be desirable in certain applications of this invention to sacrifice a wide range of adjustment for increased resolution as might be obtained by the use of a plurality of equal sized electrodes.

In operation, a single cycle of a repetitive analog waveform is clocked into the input/output shift register and a plurality of charge samples proportional to the time sequential amplitude of the analog signal is created under electrodes 52a through i. During this input phase of operation, electrode 40 is maintained at a suitably low potential, for example 0 volts, that the input/output shift register portion of the invention is substantially isolated from the remaining portions. Depending upon the filtering time constant desired one or more of the electrodes 31 through 34 is energized to form a charge storage location under each of the nonelevated portions thereof. It is to be understood that electrodes 31 through 34 are energized sequentially beginning with electrode 31 and that in accordance with this embodiment of the invention no electrode is energized unless the preceding electrodes, that is to say electrodes having lower number, is energized. The electrodes under which it is not desired to form charge storage locations are supplied with a low potential, as for example 0 volts. The charge storage locations formed under the appropriately energized electrodes are terminated at the diffusion boundary under the leading edges of the nonenergized electrodes.

For example, assume that an electrical potential of −20 volts is applied to electrodes 31 and 32 and that a potential of 0 volts is applied to electrodes 33 and 34 and each of the remaining electrodes (not illustrated). A plurality of charge storage locations is formed in substrate 11 underlying the nonelevated portions of electrodes 31 and 32. Electrode 40 is now appropriately energized, as for example, by applying a potential of −20 volts to permit the charge stored in the charge storage locations underlying each of electrodes 52 thereof to equilibrate in the accumulator charge storage location including the charge storage locations underlying each of the portions of electrodes 52, 31 and 32. After the surface charge has equilibrated electrode 40 is raised to a potential of 0 volts substantially isolating the portion or the accumulator charge storage location formed as hereinabove described under electrodes 52 from the remaining portions. The charge samples which are a fraction of the total charge in each cell and are therefore the smoothed version of the sample, underlying electrodes 52a, and i are now serially clocked out by the shift register and may be utilized as desired to reconstruct an analog wave signal waveform. It will be appreciated that the ratio between the areas underlying electrodes 52a, c, e, g and i to the total accumulator area including those areas and the selected ones of electrodes 31 through 34 determines the filtering time constant.

While FIG. 3 illustrates an embodiment of this invention wherein accumulator electrodes 31 to 34 are separated by diffusions, it is to be understood that the structure illustrated hereinabove in conjunction with FIG. 1 might equally well be employed and would have similar operating characteristics. Further, while the invention is described in terms of surface charge transfer storage and transfer structures, other charge transfer structures such as buried channel structures employing a region of opposite conductivity type at one surface such as those described in U.S. Pat. No. 3,902,187 to Engeler and Tiemann entitled SURFACE CHARGE STORAGE AND TRANSFER DEVICES may be employed.

While the invention has been particularly shown and described with reference to several preferred embodiments thereof, it will be understood by those skilled in the art that various changes in form and detail may be made therein without departing from the true spirit and scope of the invention as defined by the appended claims.

What is claimed is:

1. In combination,
a substrate of semiconductor material of one conductivity type having a major surface,
means forming a charge storage region adjacent said major surface of said substrate including a first and a second electrode, each insulatingly overlying said storage region,
means for enlarging in steps the charge storage capability of said storage region by selectively coupling in steps each of a plurality of additional storage regions to the portion of said storage region underlying said first electrode, said additional storage regions forming a series with each member of the series coupling to a preceding member thereof except the first member which couples with the portion of said storage region underlying said first electrode,
a plurality of additional electrodes, each insulatingly overlying a respective one of said additional storage regions, each of said additional electrodes spaced in a plane parallel to said major surface forming a series of gaps, each gap of the series except the first being located between adjacent additional electrodes, said first gap being located between said first electrode and the additional electrode overlying the first member of said additional storage regions, the area of each additional electrode of said series being greater than the area of a preceding additional electrode of said series,
sampling means for developing a sequence of first quantities of charge, each quantity corresponding to a respective value of a series of successive values of an analog signal,
introducing means including said second electrode for introducing serially each of said quantities of charge of said sequence into said storage region,
removing means including said second electrode for removing periodically a fixed fraction less than 1 of the total of said first quantities of charge contained in said storage region to provide a sequence of second quantities of charge, said fixed fraction of charge periodically removed from said storage region by said removal means being determined by the ratio of the area of said second electrode overlying said substrate to the total area of said first, second electrodes and additional electrodes overlying said substrate.

2. The combination of claim 1 in which the areas of said additional electrodes form a geometric series with said area of said first electrode.

* * * * *